United States Patent
Park

(10) Patent No.: US 8,367,499 B2
(45) Date of Patent: Feb. 5, 2013

(54) METHOD FOR MANUFACTURING SEMICONDUCTOR DEVICE WITH FIRST AND SECOND GATES OVER BURIED BIT LINE

(75) Inventor: Hyung Jin Park, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 126 days.

(21) Appl. No.: 12/969,511

(22) Filed: Dec. 15, 2010

(65) Prior Publication Data

US 2012/0018799 A1   Jan. 26, 2012

(30) Foreign Application Priority Data

Jul. 23, 2010  (KR) .................... 10-2010-0071529

(51) Int. Cl.
*H01L 29/772* (2006.01)
*H01L 21/336* (2006.01)

(52) U.S. Cl. ........ 438/268; 438/156; 438/206; 438/270; 438/430; 257/329; 257/E21.41; 257/E29.242

(58) Field of Classification Search .................. 438/156, 438/206, 268, 270, 430, 700; 257/328, 329, 257/E21.41, E29.242, E29.262
See application file for complete search history.

(56) References Cited

U.S. PATENT DOCUMENTS

2008/0173936 A1* 7/2008 Yoon et al. .................... 257/329
2011/0227145 A1* 9/2011 Renn .............................. 257/328

FOREIGN PATENT DOCUMENTS

JP   2008-177565 A   7/2008

\* cited by examiner

*Primary Examiner* — Hsien Ming Lee
*Assistant Examiner* — Walter H Swanson

(57) ABSTRACT

A semiconductor device and a method for manufacturing the same are provided. The method includes forming a cell structure where a storage node contact is coupled to a silicon layer formed over a gate, thereby simplifying the manufacturing process of the device. The semiconductor device includes a bit line buried in a semiconductor substrate; a plurality of gates disposed over the semiconductor substrate buried with the bit line; a first plug disposed in a lower portion between the gates and coupled to the bit line; a silicon layer disposed on the upper portion and sidewalls of the gate; and a second plug coupled to the silicon layer disposed over the gate.

14 Claims, 15 Drawing Sheets

METHOD FOR MANUFACTURING SEMICONDUCTOR DEVICE WITH FIRST AND SECOND GATES OVER BURIED BIT LINE

CROSS-REFERENCE TO RELATED APPLICATION

The priority of Korean patent application No. 10-2010-0071529 filed on Jul. 23, 2010, the disclosure of which is hereby incorporated in its entirety by reference, is claimed.

BACKGROUND OF THE INVENTION

The present invention relates to a semiconductor device having a 4F2 structure and a method for manufacturing the same.

As the integration of semiconductor devices has been increased, a two-dimensional area occupied by each unit cell has been decreased. With the decrease of the area occupied by the unit cell, various methods have been introduced to form a transistor, a bit line, a word line and a capacitor in a limited area.

As one of those methods, a semiconductor device having a vertical transistor has been suggested. In such a semiconductor device, a source region and a drain region of the vertical transistor are arranged upward and downward in an active region so that a vertical channel may be formed.

In the vertical transistor, a gate is formed on sidewalls of a silicon pillar included in the active region. With respect to the gate, the source region is formed at an upper side of the silicon pillar, and the drain region is formed in a silicon substrate disposed below the silicon pillar. In the semiconductor device including this vertical transistor, a cell scheme is reduced to a 4F2 structure, resulting in increasing a net die. However, a manufacturing process of the semiconductor device including the vertical transistor is complicated.

BRIEF SUMMARY OF THE INVENTION

Various embodiments of the invention are directed to a semiconductor device having a 4F2 structure and a method for manufacturing the same.

According to an embodiment of the present invention, a semiconductor device comprises: a bit line buried in a semiconductor substrate; a plurality of gates disposed over the semiconductor substrate buried with the bit line; a first plug disposed in a lower portion between the gates and coupled to the bit line; a silicon layer disposed over the upper portion and sidewalls of the gate; and a second plug coupled to the silicon layer disposed over the gate.

The bit line includes tungsten. The first plug and the second plug include doped polysilicon. The first plug and the second plug are a source/drain region, respectively. The silicon layer includes a silicon compound. The silicon layer is a channel region. The silicon layer further includes a storage node contact coupled to the second plug.

According to an embodiment of the present invention, a method for manufacturing a semiconductor device comprises: forming a buried bit line in a semiconductor device; forming a plurality of gates over the semiconductor substrate including the buried bit line; forming a first plug coupled to the bit line in a lower portion disposed between the gates; forming a silicon layer coupled to the first plug on the upper portion and at sidewalls of the gate; and forming a second plug over the silicon layer disposed over the gate.

The forming-a-buried-bit-line further includes: etching the semiconductor substrate to form a recess; burying tungsten in the recess; and planarizing the resulting structure to expose the semiconductor substrate.

The forming-a-first-plug further includes: forming a polysilicon layer disposed between the gates; and etching the polysilicon layer by an etch-back process so that the polysilicon layer remains in the lower portion disposed between the gates.

The forming-a-silicon-layer includes: forming a silicon layer on the resulting structure including the gate and the first plug; and removing the silicon layer formed on the surface of the first plug. The is forming-a-silicon layer is performed by an atomic layer deposition (ALD) process.

The forming-a-second-plug includes: forming insulating patterns that opens the silicon layer disposed over the gate; and burying a polysilicon layer in a space between the insulating patterns.

The first plug and the second plug are used as a source/drain region, respectively. The silicon layer is used as a channel region.

According to an embodiment of the present invention, a method for manufacturing a semiconductor device comprises: forming a buried bit line in a semiconductor substrate; forming a first plug coupled to the bit line over the semiconductor substrate; forming an interlayer insulating pattern over a middle portion of the first plug; growing a first silicon layer at both sides of the interlayer insulating pattern over the semiconductor substrate including the first plug; removing the first silicon layer disposed in a gate-expected region so that the first silicon layer remains over an edge of the first plug; burying a conductive material in the gate-expected region to form a gate; growing a second silicon layer over the first silicon layer and the gate; and forming a second plug over the second silicon layer.

The forming-a-first-plug further includes: forming a doped polysilicon layer over the semiconductor substrate; and patterning the doped polysilicon.

The growing-a-first-silicon-layer is performed with silicon of the semiconductor substrate as a seed by a selective epitaxial growth (SEG) process. The conductive material includes tungsten. The growing-a-second-silicon-layer is performed with silicon of the semiconductor substrate as a seed by a selective epitaxial growth (SEG) process. The growing-a-second-silicon-layer further comprises removing the second silicon layer disposed over the interlayer insulating film in order to separate the second silicon layer coupled between the gates.

The forming-a-second-plug includes: forming an insulating film over the semiconductor substrate including the first silicon layer, the second silicon layer and the first plug; etching the insulating film to form an insulating pattern that opens the second silicon layer disposed over the gate; and burying a polysilicon layer disposed between the insulating patterns. The method according to claim 13, wherein the first plug and the second plug are a source/drain region, respectively. The first silicon layer and the second silicon layer are used as a channel region.

DESCRIPTION OF EMBODIMENTS

The present invention will be described in detail with reference to the accompanying drawings.

Figure 1:
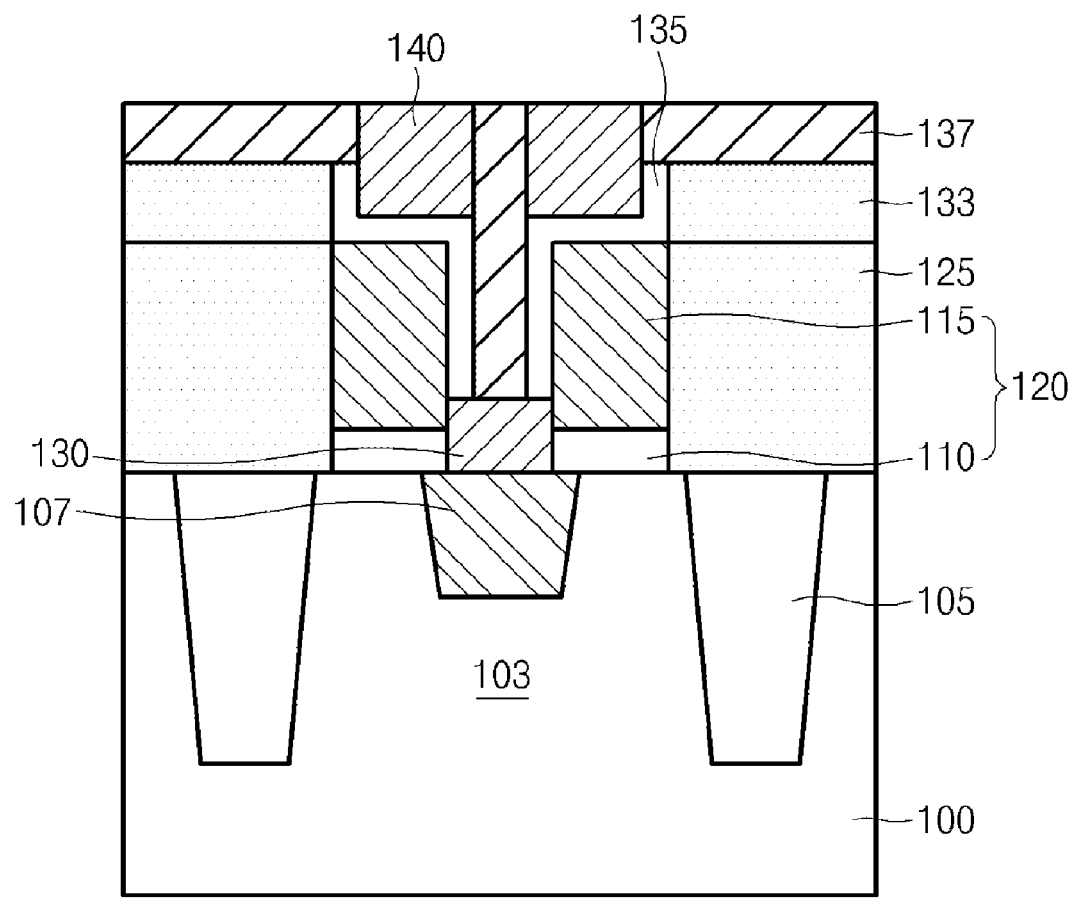
FIG. 1 is a cross-sectional view illustrating a semiconductor device according to an embodiment of the present invention.

FIG. 1 is a cross-sectional view illustrating a semiconductor device according to an embodiment of the present invention.

Referring to FIG. 1, an active region 103 and a device isolation film 105 are disposed in a semiconductor substrate 100. A buried bit line 107 is located in the active region 103. A plurality of gates 120 is disposed over the active region 103. The buried bit line 107 is disposed at the middle part of the active region 103.

A first plug 130 coupled to the buried bit line 107 is located at a lower portion between the gates 120. A second plug 140 is disposed over the gate 120. A silicon layer 135 is positioned to connect the first plug 130 and the second plug 140. The silicon layer 135 is disposed on the top surface and sidewalls of the gate 120. That is, the silicon layer 135 is disposed between the second plug 140 and the gate 120. The first plug 130 is coupled to one end portion of the silicon layer 135. The first plug 130 and the second plug 140 are used as source/drain regions, respectively. The silicon layer 135 is used as a channel region for connecting the source/drain regions. A storage node contact (not shown) is disposed over the second plug 140. The silicon layer 135 is coupled with the storage node contact (not shown) and includes a folded structure disposed over the gate 120, thereby implementing a 4F2 device with a simple structure.

Figure 2A:
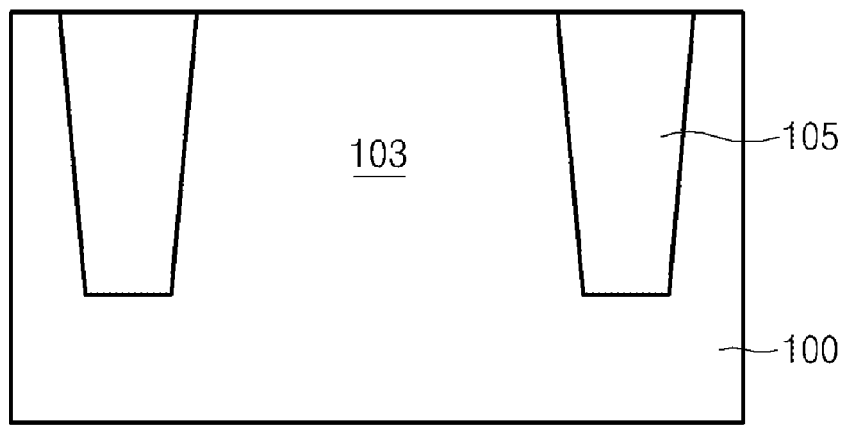
FIGS. 2*a* to 2*o* are cross-sectional views illustrating a method for manufacturing the semiconductor device in FIG. 1 according to an embodiment of the present invention.
Figure 2B:
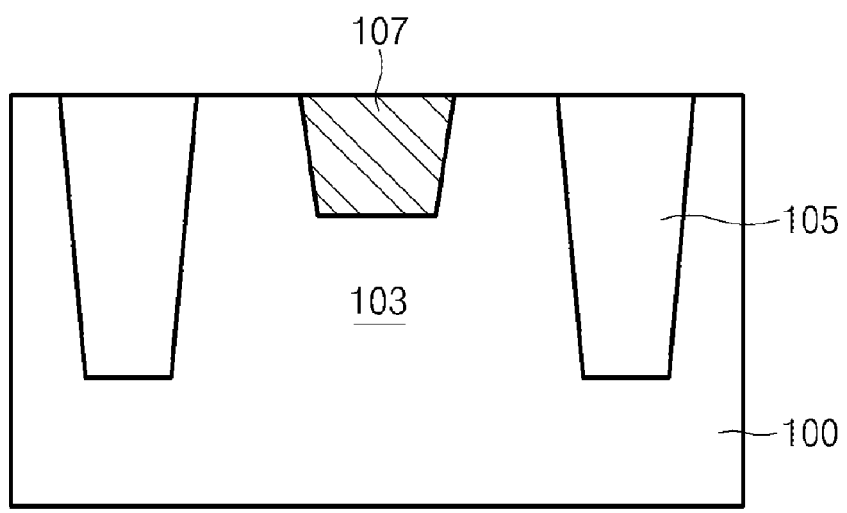
Figure 2C:
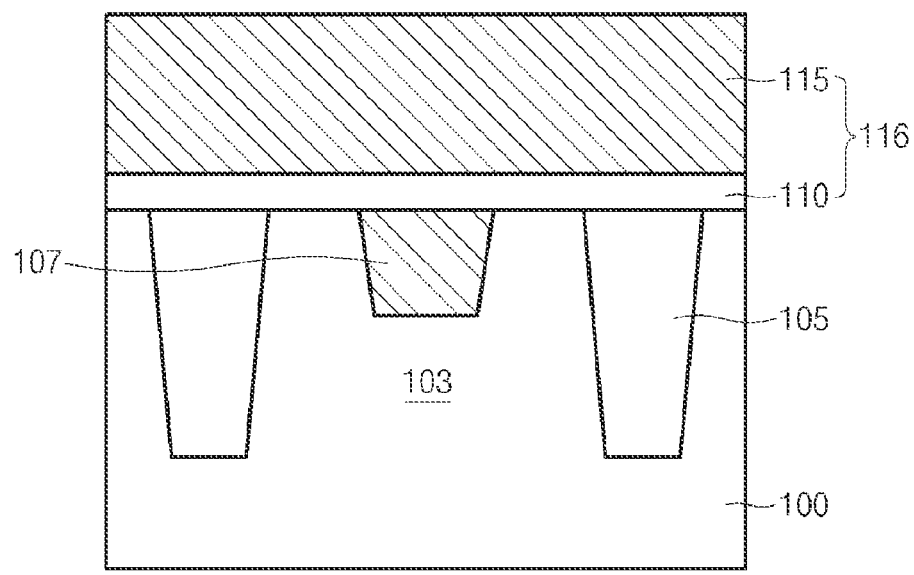
Figure 2D:
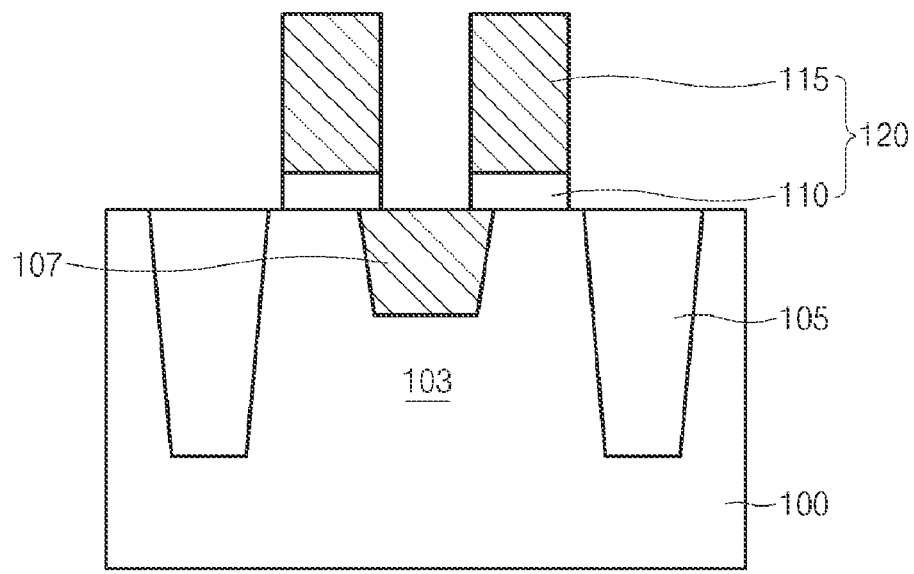
Figure 2E:
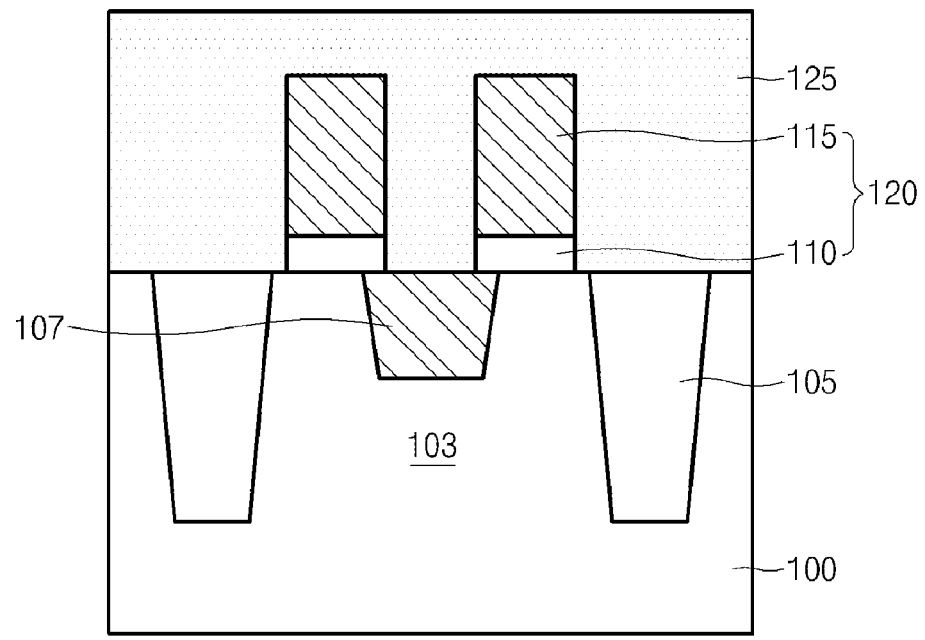
Figure 2F:
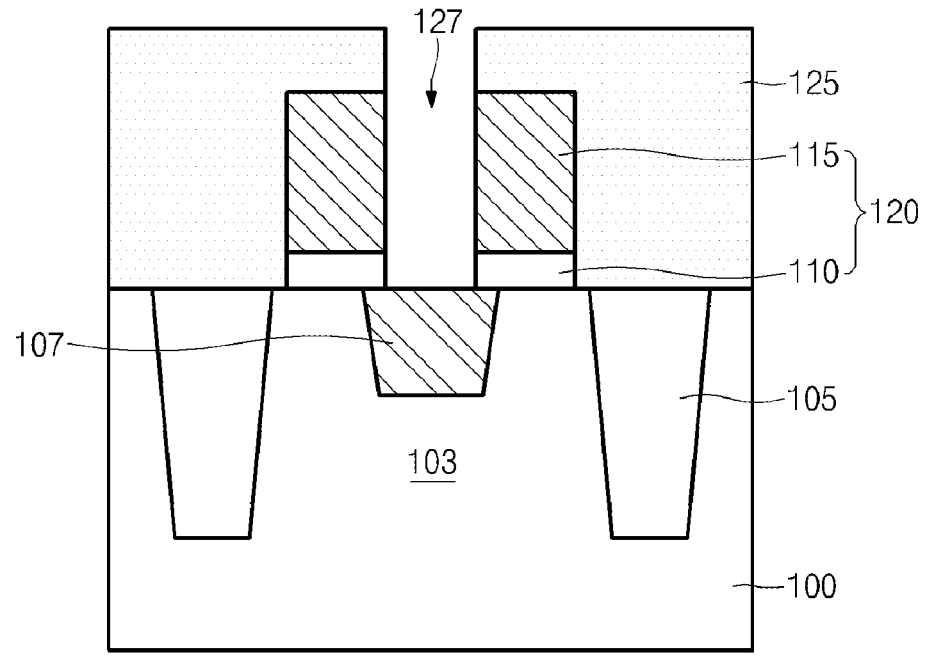
Figure 2G:
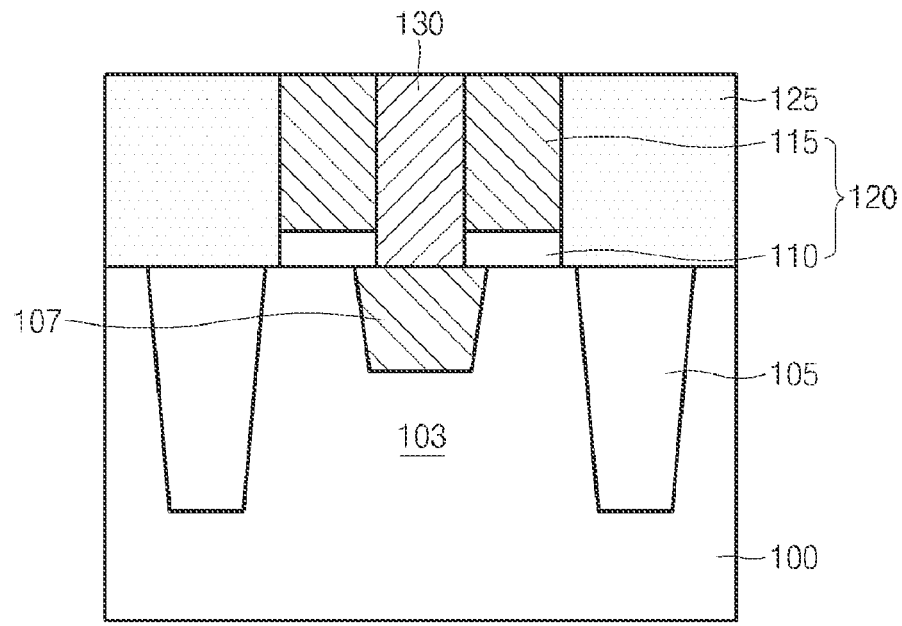
Figure 2H:
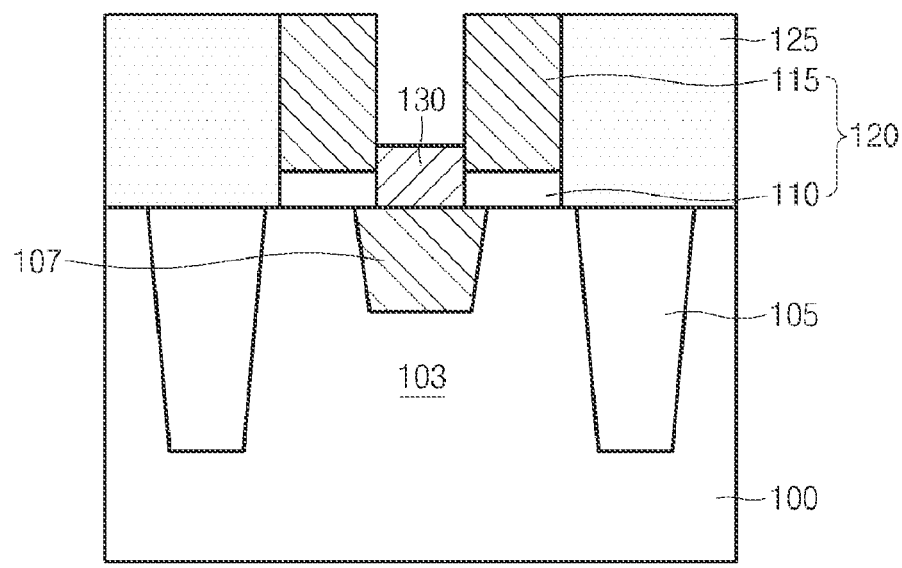
Figure 2I:
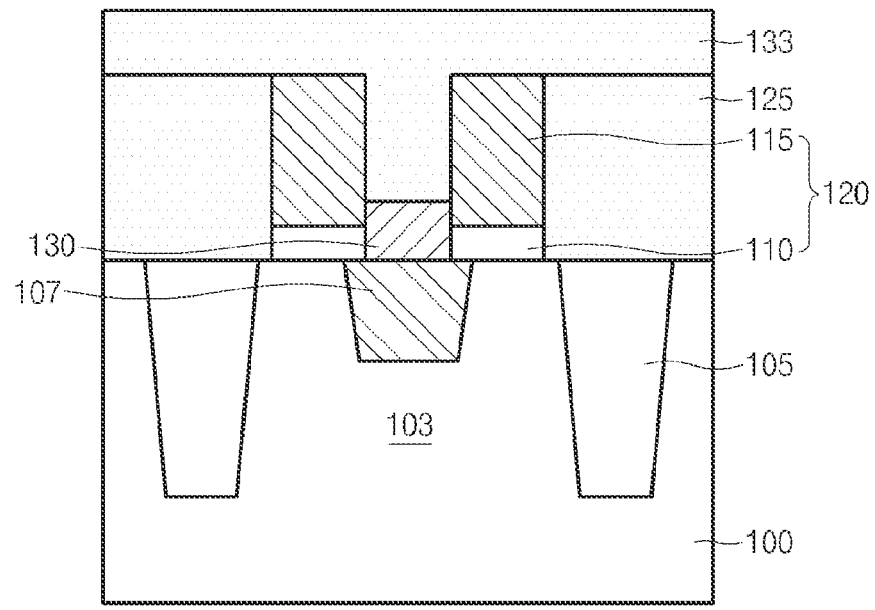
Figure 2J:
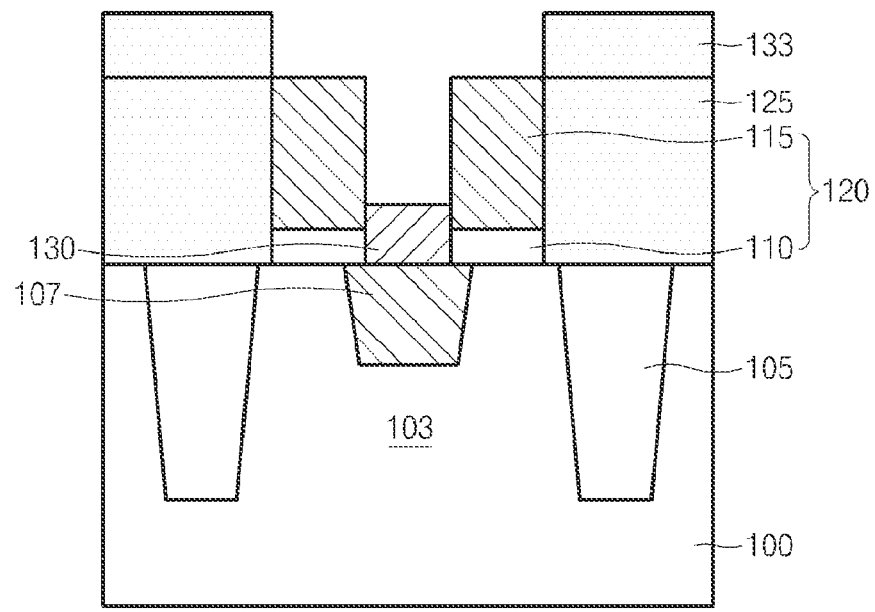
Figure 2K:
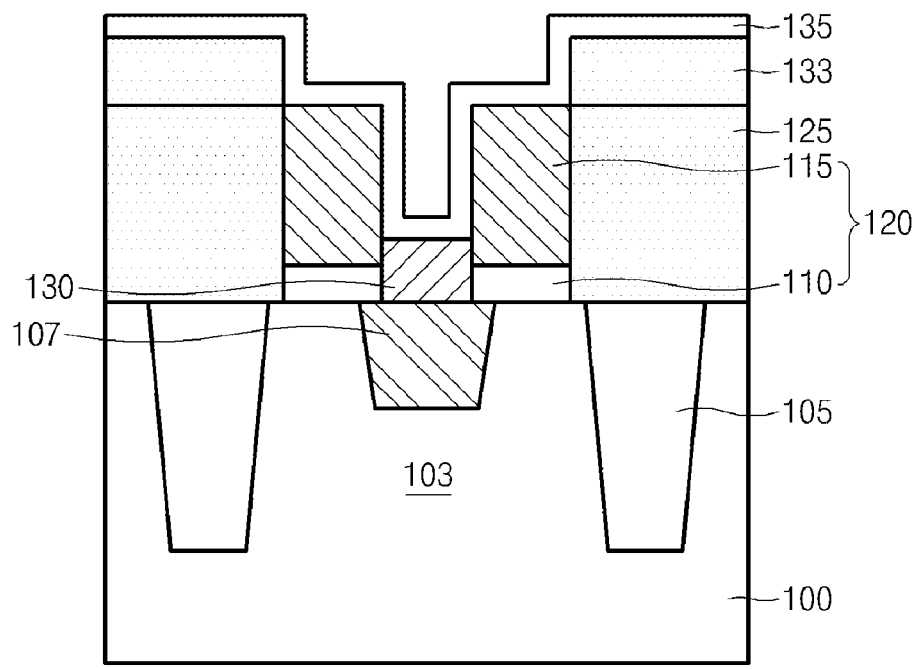
Figure 2L:
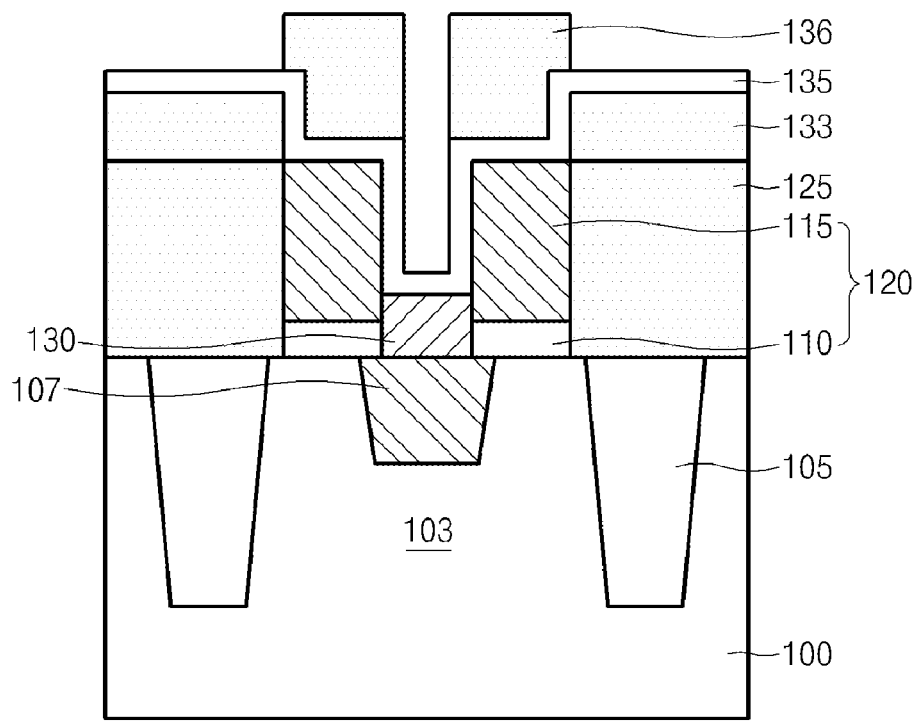
Figure 2M:
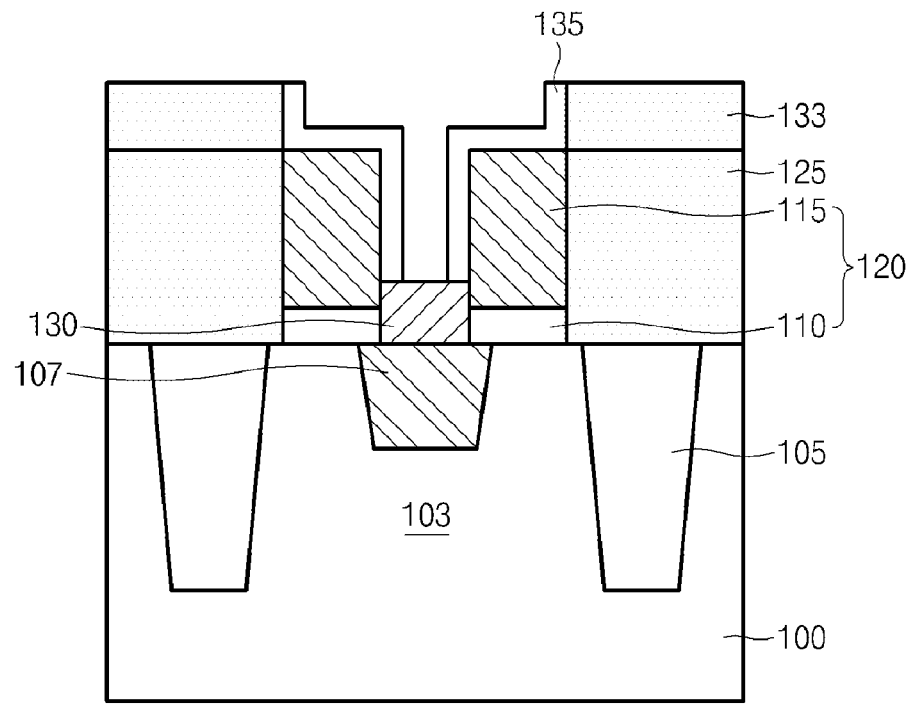
Figure 2N:
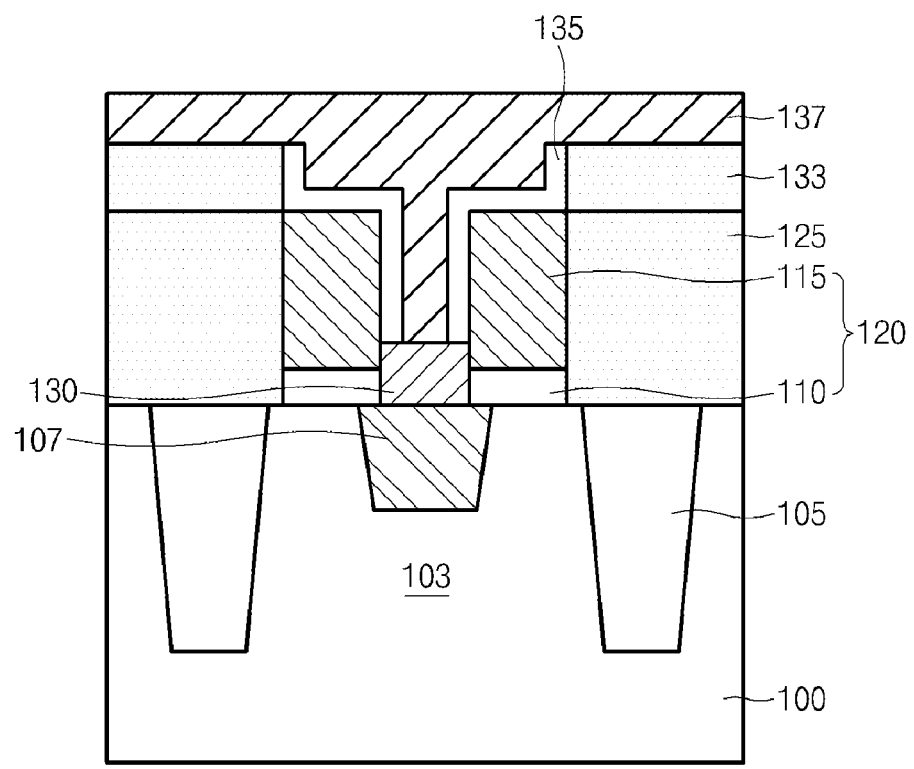
Figure 2O:
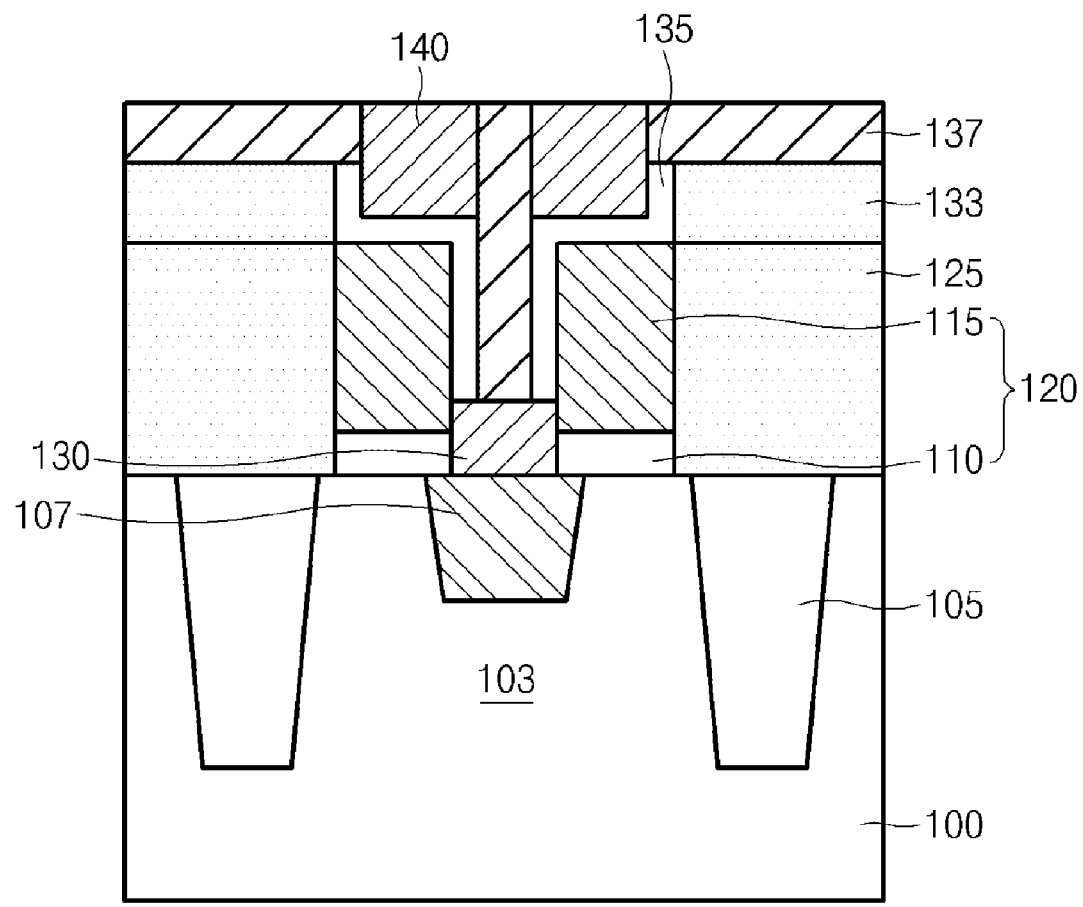

FIGS. 2a to 2o are cross-sectional views illustrating a method for manufacturing the semiconductor device in FIG. 1 according to an embodiment of the present invention.

Referring to FIG. 2a, parts of the semiconductor substrate 100 are removed to form a device isolation trench defining the active region 103. The active region 103 is formed of a line type as in a 6F2 structure. An oxide may be buried in the device isolation trench to form the device isolation film 105. In this embodiment, the semiconductor substrate 100 includes p-type silicon. If the semiconductor substrate 100 includes a glass substrate, it is unnecessary to form the device isolation film because electrical connection cannot occur between patterns used as an active region.

Referring to FIG. 2b, a part of the active region 103 of the semiconductor substrate 100 is removed to form a trench for a bit line. Then, a bit line material is deposited over the resultant structure including the trench, and an etch-back process is performed on the deposited bit line material to expose the semiconductor substrate 100, thereby forming the buried bit line 107. During the etch-back process, the device isolation film 105 serves as an etch barrier so that the top-surface height of the device isolation film 105 is substantially the same as that of the buried bit line 107. The bit line material may include tungsten. A capping nitride film (not shown) is formed over the semiconductor substrate 100 including the device isolation film 105 and the bit line 107. The capping nitride film (not shown) serves as a protection film between the active region 103 and a gate which is to be is formed in a subsequent process, and is formed to prevent the bit line 107 from being oxidized. As described above, when the semiconductor substrate 100 includes a glass substrate, it is not necessary to form the capping nitride film because the glass substrate is electrically separated from a metal layer used as a gate.

Referring to FIG. 2c, a gate material layer 116 is formed over the capping nitride film (not shown). The gate material layer 116 may have a stacked structure of a gate insulating layer 110 and a gate metal layer 115. The gate insulating layer 110 may be formed of a nitride, and the gate metal layer 115 may be formed of tungsten.

Referring to FIG. 2d, the gate material layer 116 is patterned to form a gate 120 over the active region 103, and two gates 120 are formed over one active region 103. A spacer (not shown) is formed on sidewalls of the gate 120. The spacer (not shown) is formed using a low-k material to electrically insulate the gate 120 from the bit line 107.

Referring to FIG. 2e, a first interlayer insulating film 125 is formed over a resultant structure including the gate 120, and the first interlayer insulating film 125 is planarized through a chemical mechanical polishing (CMP) process. The first interlayer insulating film 125 includes a low-k material such as a boron phosphorous silicate glass (BPSG) oxide. The first interlayer insulating film 125 is formed to cover the gates 120.

Referring to FIG. 2f, a part of the first interlayer insulating film 125 disposed between two neighboring gates 120 is removed to form a trench 127 that exposes the bit line 107. The process of forming the is trench 127 is performed using a mask for a bit line contact plug.

Referring to FIG. 2g, a conductive material is buried in the trench 127 to form the first plug 130. The first plug 130 includes polysilicon or tungsten, or both. If the first plug 130 includes polysilicon, the polysilicon may be N-type polysilicon.

Referring to FIG. 2h, the first plug 130 filling the trench is recessed to remain in a lower portion between the gates 120. As a result, sidewalls of upper portions of the gates 120 are exposed.

Referring to FIG. 2i, a second interlayer insulating film 133 is formed to cover a resultant structure including the gate 120, the first interlayer insulating film 125 and the first plug 130. The second interlayer insulating film 133 may include a low-k material such as a BPSG oxide. Referring to FIG. 2j, a mask pattern (not shown) is formed over the second interlayer insulating film 133. The mask pattern (not shown) is formed with the same mask as that used when forming the trench for the device isolation films that defines the active region 103 in FIG. 2a.

A part of the second interlayer insulating film 133 that is disposed over the active region 103 is removed using the mask pattern (not shown) as an etch mask. As a result, the upper portion and one side surface of the gate 120 is exposed, and the top surface of the first plug 130 is exposed. In the etching process of the second interlayer insulating film 133, the etching is performed until the top surface of the first plug 130 is exposed.

Referring to FIG. 2k, a silicon layer 135 is formed along the exposed portions of the second interlayer insulating film 133, the gate 120 and the first plug 130. The silicon layer 135 is formed to be used as a channel region.

Referring to FIG. 2l, after a sacrificial film is formed over the silicon layer 135, the sacrificial film is patterned so that a sacrificial pattern 136 remains over the gate 120.

Referring to FIG. 2m, a portion of the silicon layer 135 uncovered by the sacrificial pattern 136 is removed so that the silicon layer 135 remains on the top surface and one side surface of the gate 120. As a result, the top surface of the first plug 130 is exposed. With respect to the top surface of the gate 120, the silicon layer 135 is formed downwards along the sidewall of the gate 120 at one side of the gate 120, and the silicon layer 135 is formed upwards along a sidewall of the second interlayer insulating film 133 at the other side of the gate 120. After that, the sacrificial pattern 136 is removed.

Referring to FIG. 2n, a third interlayer insulating film 137 is formed over a resultant structure including the first plug 130, the second interlayer insulating film 133 and the silicon layer 135 where the sacrificial pattern 136 is removed.

Referring to FIG. 2o, a portion of the third interlayer insulating film 137 disposed over the gate 120 is removed to expose the silicon layer 135 formed over the gate 120. A conductive material is buried in a region where the third interlayer insulating film 137 is removed, thereby forming a second plug 140. The conductive material used to form the second plug 140 may include doped polysilicon. During the process for forming the second plug 140, a dopant in polysilicon moves into the silicon layer 135 so that the dopant concentration of the silicon layer 135 formed on the top surface of the gate 120 becomes higher than that of the silicon layer 135 formed on the sidewall of the gate 120. Then, a storage node contact (not shown) is formed to be coupled with the second plug 140.

As mentioned above, the silicon layer 135 is formed on the sidewall of the gate 120 so that the silicon layer 135 is used as the channel region. The first plug 130 is formed under the silicon layer 135, and the second plug 140 is formed over the silicon layer 135. The first plug 130 and the second plug 140 are used as the source/drain regions, thereby implementing the 4F2 structure with a simple process.

FIGS. 3a to 3l are cross-sectional views illustrating a method for manufacturing a semiconductor device according to another embodiment of the present invention.

Figure 3A:
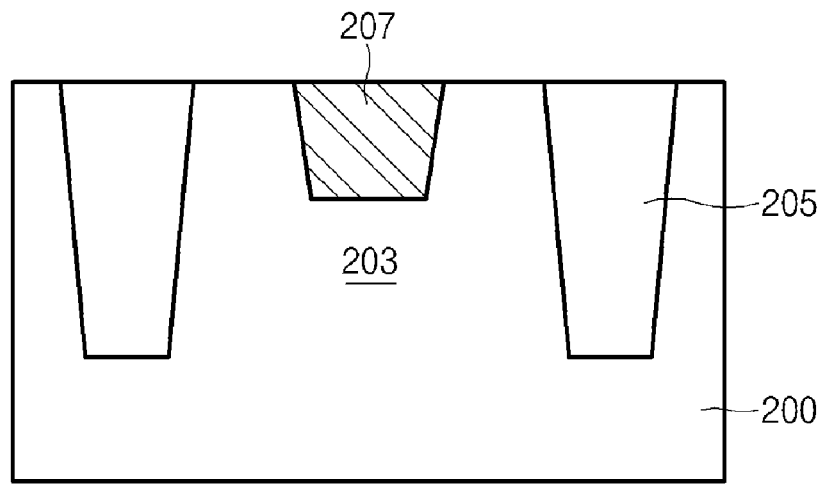
FIGS. 3a to 3l are cross-sectional views illustrating a method for manufacturing a semiconductor device according to another embodiment of the present invention.

Referring to FIG. 3a, a semiconductor substrate 200 is etched to form a trench for device isolation defining an active region 203. In this embodiment, the semiconductor substrate 200 includes P-type silicon. The active region 203 is formed of a line type as in a 6F2 structure. An oxide is buried in the trench for the device isolation to form a device isolation film 205.

A portion of the active region 203 in the semiconductor is substrate 200 is removed to form a trench for a bit line. After a bit line material is deposited over a resultant structure including the trench for the bit line, an etch-back process is performed to expose the top surface of the semiconductor substrate 200, thereby forming a buried bit line 207. During the etch-back process, the device isolation film 205 serves as an etch barrier so that the top-surface height of the device isolation film 205 is substantially the same as that of the buried bit line 207. The bit line material may include tungsten.

Figure 3B:
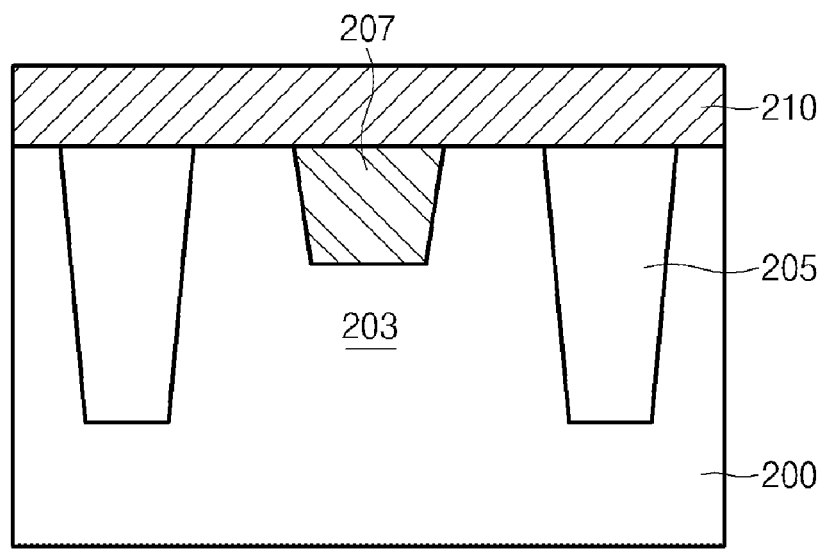

Referring to FIG. 3b, a polysilicon layer 210 is formed over the semiconductor substrate 200 including the bit line 207. The polysilicon layer 210 includes N-type doped polysilicon.

Figure 3C:
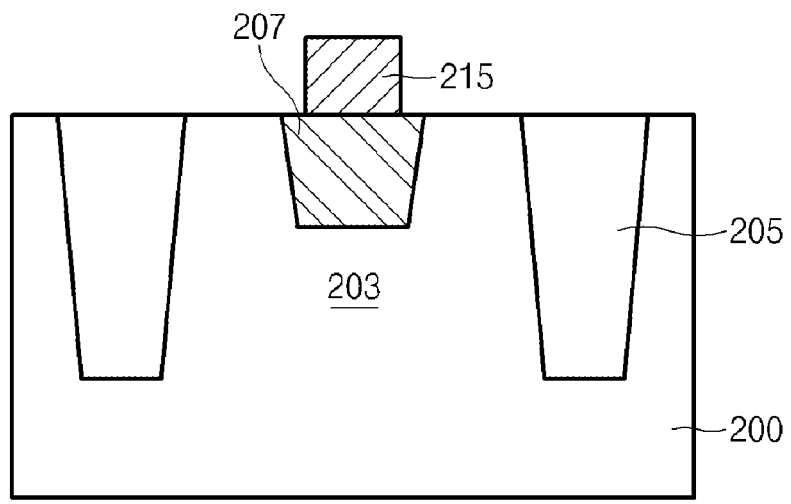

Referring to FIG. 3c, the polysilicon layer 210 is patterned to remain over the bit line 207. In a subsequent process, the remaining portion of the polysilicon layer 210, i.e., a first plug 215, is used as a source region.

Figure 3D:
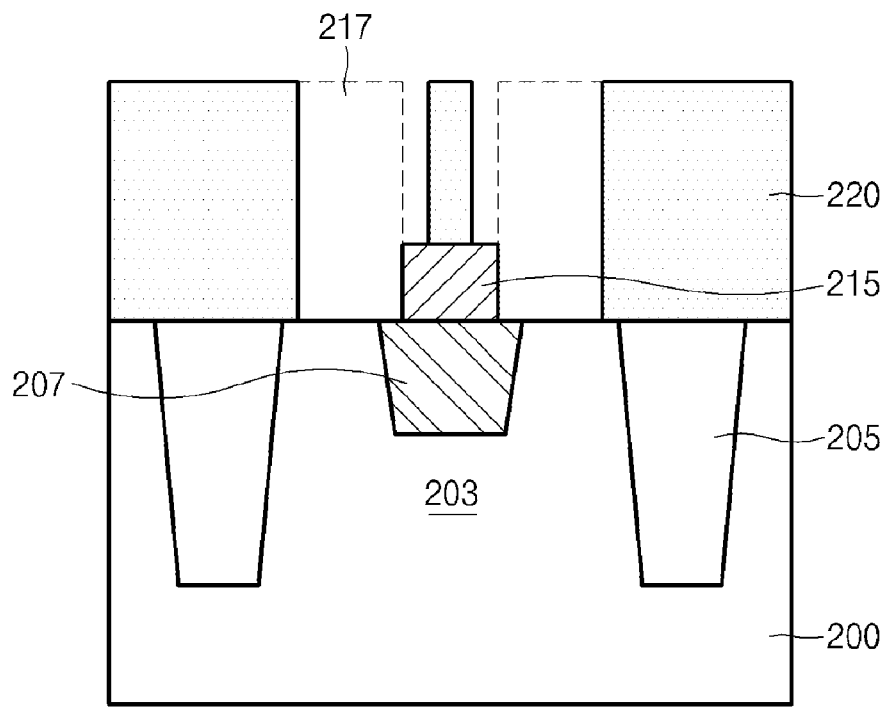

Referring to FIG. 3d, a first interlayer insulating film is formed over a resultant structure including the first plug 215. The first interlayer insulating film is selectively etched to expose the top surface of the semiconductor substrate 200 corresponding to a gate-expected region 217 and to form a first interlayer insulating pattern 220, wherein both sides of the first interlayer insulating pattern 220 disposed on the first plug 215 are exposed, and wherein a gate is to be formed in the gate-expected region 217.

Figure 3E:
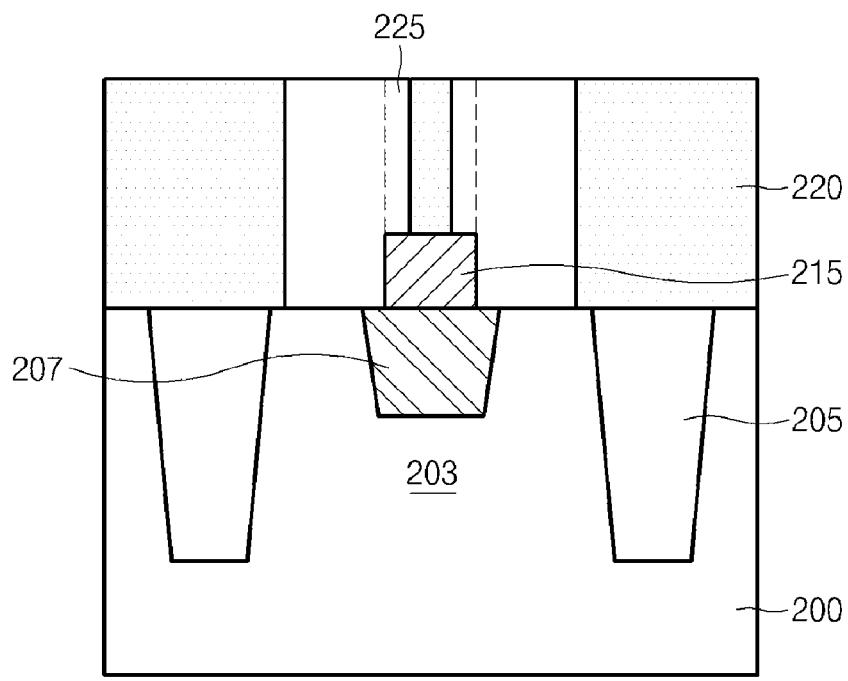

Referring to FIG. 3e, a selective epitaxial growth (SEG) process is performed on the portions of the semiconductor substrate 200 exposed by the first interlayer insulating pattern 220, thereby growing a first silicon epitaxial layer 225. A planarizing process is performed on the first silicon epitaxial layer 225 until the top surface of the first interlayer insulating pattern 220 is exposed.

Figure 3F:
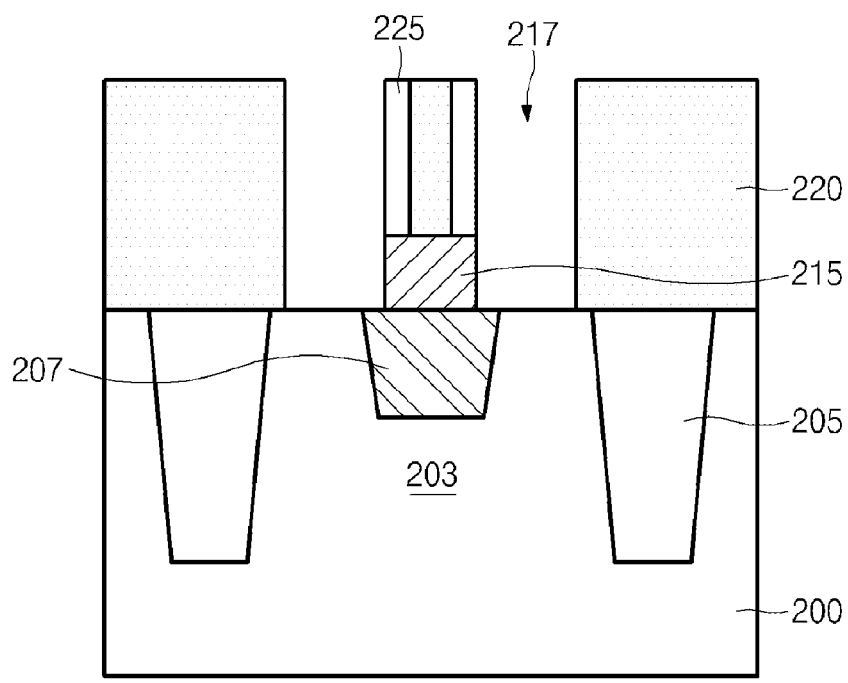

Referring to FIG. 3f, the first silicon epitaxial layer 225 in the gate-expected region 217 is removed so that a portion of the first silicon epitaxial layer 225 remains over the first plug 215. In a subsequent process, the remaining first silicon epitaxial layer 225 serves as a channel region.

Figure 3G:
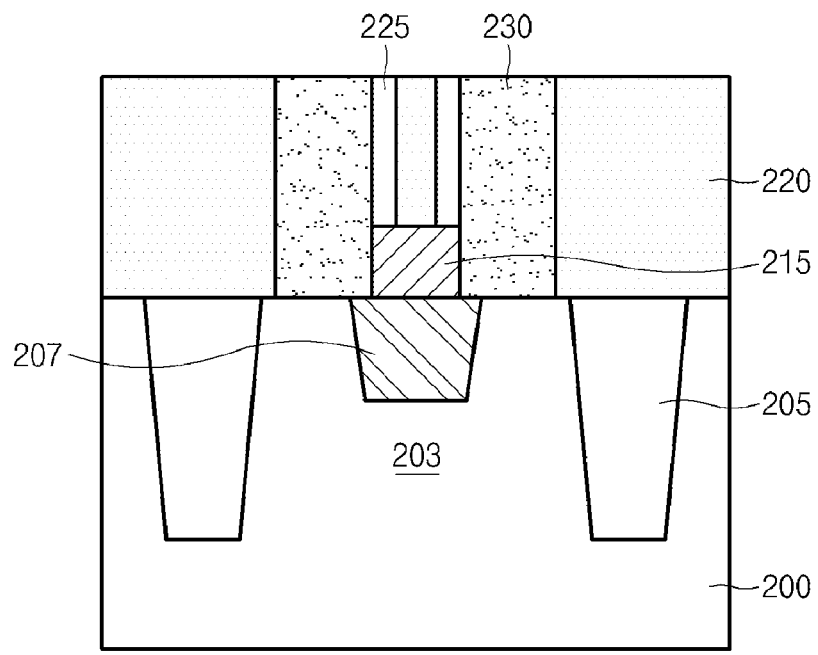

Referring to FIG. 3g, after a gate insulating film (not shown) is formed on the exposed semiconductor substrate 200 corresponding to the gate-expected region 217, a material including tungsten is buried in the gate-expected region 217 to form a gate 230.

Figure 3H:
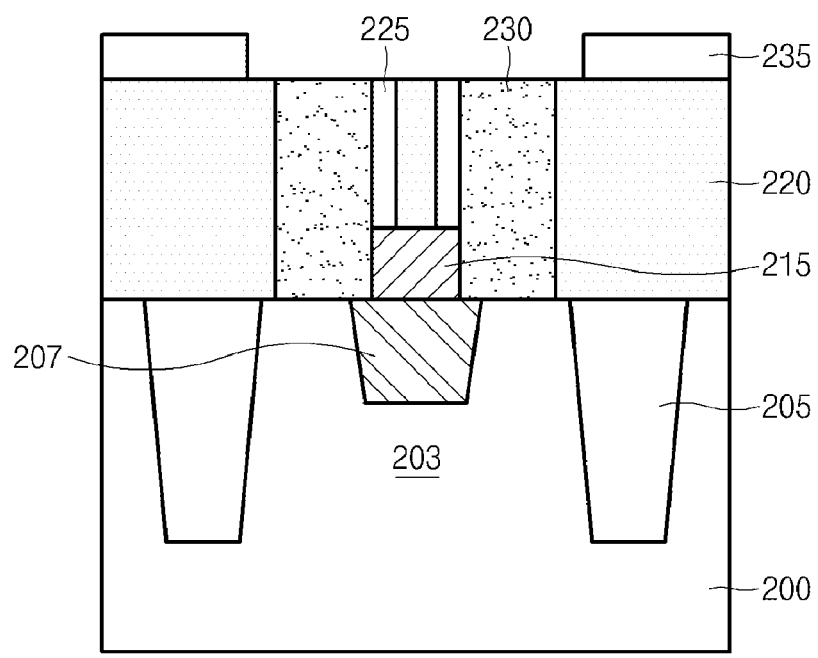

Referring to FIG. 3h, an etch barrier film for a storage electrode is formed over a resultant structure including the gate 230. The etch barrier film is formed of a material including a nitride. The etch barrier film is patterned to form an etch barrier pattern 235 over the first interlayer insulating pattern 220 formed at both sides of the gate 230. That is, a portion of the etch barrier film corresponding to the active region 203 is removed to form the etch barrier pattern 235.

Figure 3I:
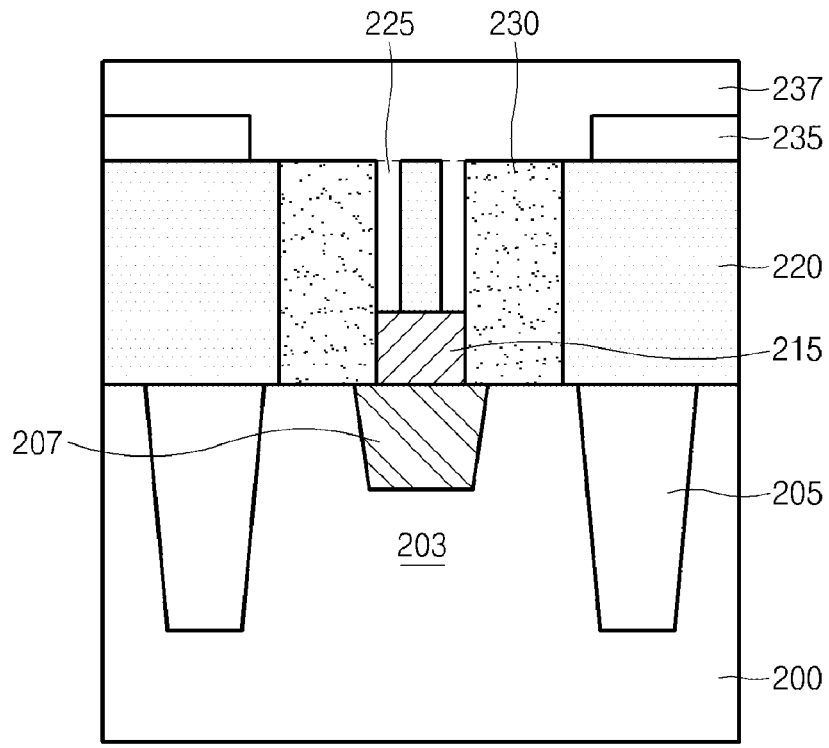

Referring to FIG. 3i, a second silicon epitaxial layer 237 is grown over a resulting structure including the etch barrier pattern 235. The second silicon epitaxial layer 237 is formed using the first silicon epitaxial layer 225 as a seed through the SEG process. The second silicon epitaxial layer 237 is also grown over the gate 230 and the etch barrier pattern 235.

Figure 3J:
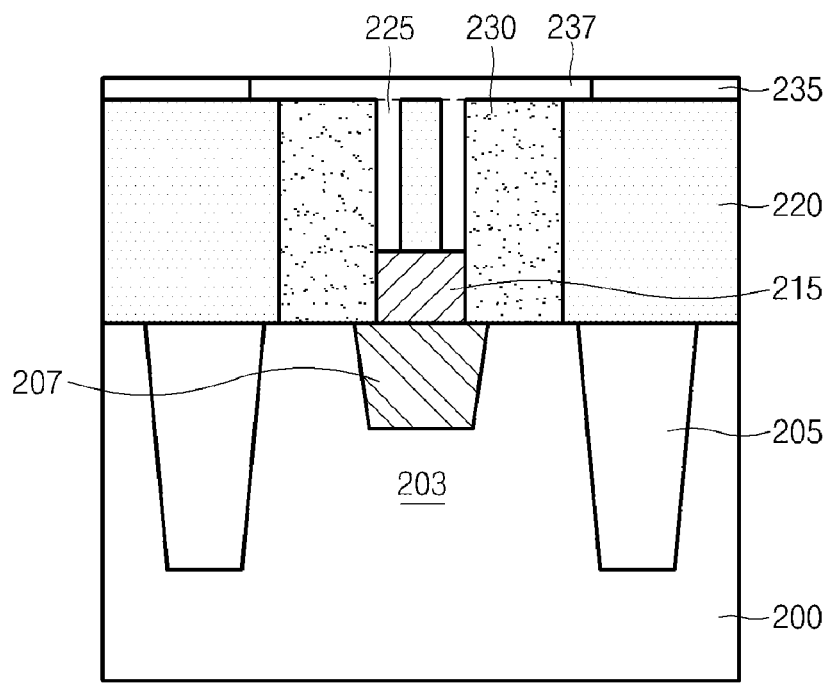

Referring to FIG. 3j, the second silicon epitaxial layer 237 is planarized until the etch barrier pattern 235 is exposed. During the planarization process, an upper portion of the etch barrier pattern 235 may be partially removed.

Figure 3K:
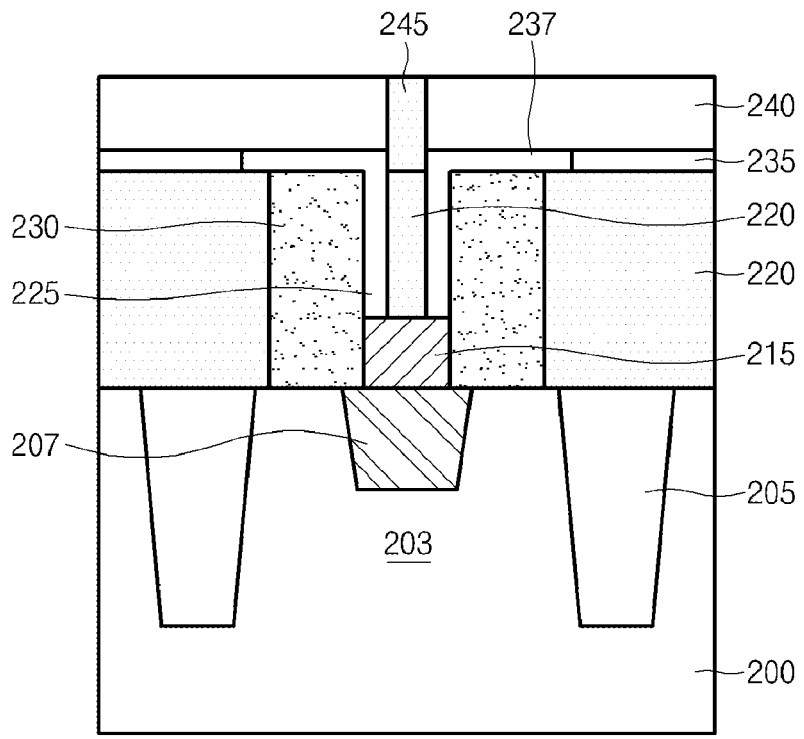

Referring to FIG. 3k, a second interlayer insulating film 240 is formed over the etch barrier film 235 and the second silicon epitaxial layer 237. Portions of the second silicon epitaxial layer 237 and the second interlayer insulating film 240 disposed over the first interlayer insulating pattern 220 that is formed between the first silicon epitaxial layers 225 are removed to expose the top surface of the first interlayer insulating pattern 220. A third interlayer insulating film 245 is buried in a portion where the second interlayer insulating film 240 and the second silicon epitaxial layer 237 are removed, thereby separating the second silicon epitaxial layer 237 into two layers that are disposed over two neighboring gates 230, respectively.

Figure 3L:
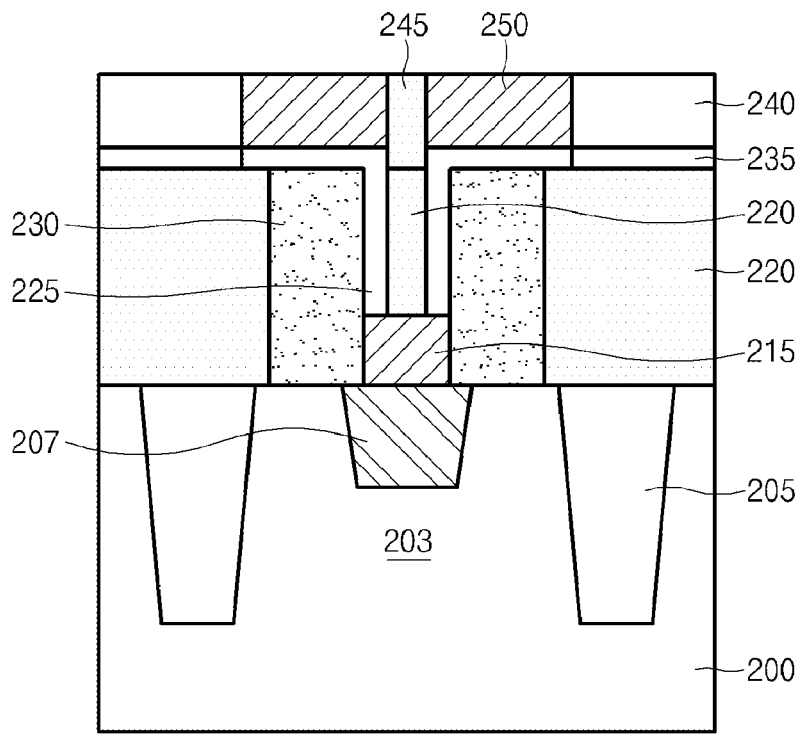

Referring to FIG. 3l, portions of the second interlayer insulating film 240 at both sides of the third interlayer insulating film 245 are removed to form trenches exposing the top surface of the second silicon epitaxial layer 237. A conductive material is buried in the trench to form a second plug 250. The conductive material may include doped polysilicon. The second plug 250 is used as a drain region in a is subsequent process. Then, a storage node contact (not shown) is formed to be coupled with the second plug 250.

As described above, a silicon layer is formed on the sidewall of the gate 230 so that it can be used as a channel region. The first plug 215 is formed under the silicon layer, and the second plug 250 is formed over the silicon layer. The first plug 215 and the second plug 250 are used as source/drain regions, thereby obtaining effects of: forming a cell structure where a storage node contact is coupled to a silicon layer formed over a gate; reducing parasitic capacitance of a bit line to improve a sensing margin because a bit line is formed to be buried in a central part of an active region; reducing an area of the active region connected to the storage node contact, resulting in reducing a cell area and increasing a net die; and separating the gate from the storage node contact because the silicon layer is formed over the gate so as to be applied to a 4F2 structure.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
    forming a buried bit line in a substrate;
    forming first and second gates over the substrate including the buried bit line;
    forming a first plug recessed between the first and second gates, wherein the first plug is formed to be coupled to the bit line;
    forming a semiconductor layer coupled to an upper surface of the first plug and a sidewall of at least the first gate, the semiconductor layer including silicon; and
    forming a second plug over a portion of the semiconductor layer that is disposed over each of the first and second gates.

2. The method according to claim 1, wherein the forming the first plug includes:
    forming a polysilicon layer to fill a space between the first and second gates; and
    etching the polysilicon layer through an etch-back process so that the polysilicon layer remains recessed between the first and second gates.

3. The method according to claim 1, wherein the forming the semiconductor layer includes:
    forming a silicon film over the first and second gates and the first plug; and
    removing a portion of the silicon film formed over the first plug so that the silicon film remains on an upper surface and sidewalls of the first and second gates.

4. The method according to claim 1, wherein the semiconductor layer is formed using an atomic layer deposition (ALD) process.

5. The method according to claim 1, wherein the forming the second plug includes:
    forming insulating patterns to expose the semiconductor layer disposed over the first and second gates; and
    burying a polysilicon layer in a space between the insulating patterns.

6. The method according to claim 1, wherein the first plug and the second plug correspond to source and drain regions, respectively.

7. A method for manufacturing a semiconductor device, the method comprising:
    forming a buried bit line in a substrate;
    forming a first plug coupled to the bit line over the substrate;
    forming an interlayer insulating pattern over a middle portion of the first plug;
    growing a first silicon layer at both sides of the interlayer insulating pattern formed over the first plug;
    removing a portion of the first silicon layer in a gate-expected region so that the first silicon layer remains over an edge of the first plug, wherein the gate-expected region is disposed at a side of the first plug;
    burying a conductive material in the gate-expected region to form a gate;
    growing a second silicon layer over the first silicon layer and the gate; and
    forming a second plug over the second silicon layer.

8. The method according to claim 7, wherein the forming the first plug includes:
    forming a doped polysilicon layer over the substrate; and
    patterning the doped polysilicon layer to form the first plug.

9. The method according to claim 7, wherein the growing the first silicon layer is performed using silicon in the substrate as a seed and through a selective epitaxial growth (SEG) process.

10. The method according to claim 7, wherein the conductive material includes tungsten.

11. The method according to claim 7, wherein the growing the second silicon layer is performed using silicon in the first silicon layer as a seed and through a selective epitaxial growth (SEG) process.

12. The method according to claim 11, further comprising removing the second silicon layer disposed over the interlayer insulating pattern.

13. The method according to claim 7, wherein the forming the second plug includes:
    forming an insulating film over a resultant structure including the first silicon layer, the second silicon layer and the first plug;
    removing a portion of the insulating film to expose the second silicon layer formed over the gate; and
    burying a polysilicon layer in a region where the portion of the insulating film is removed.

14. The method according to claim 7, wherein the first plug and the second plug correspond to source and drain regions, respectively.

* * * * *